United States Patent
Kinoshita

(10) Patent No.: US 11,456,237 B2
(45) Date of Patent: Sep. 27, 2022

(54) SEMICONDUCTOR STORAGE DEVICE

(71) Applicant: Kioxia Corporation, Tokyo (JP)

(72) Inventor: Masako Kinoshita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 20 days.

(21) Appl. No.: 17/198,423

(22) Filed: Mar. 11, 2021

(65) Prior Publication Data
US 2022/0084909 A1 Mar. 17, 2022

(30) Foreign Application Priority Data

Sep. 17, 2020 (JP) ............................. JP2020-156582

(51) Int. Cl.
*H01L 21/00* (2006.01)
*H01L 23/48* (2006.01)
*H01L 23/528* (2006.01)
*H01L 27/11582* (2017.01)

(52) U.S. Cl.
CPC .......... *H01L 23/481* (2013.01); *H01L 23/528* (2013.01); *H01L 27/11582* (2013.01)

(58) Field of Classification Search
CPC . H01L 23/481; H01L 23/528; H01L 27/11582
See application file for complete search history.

(56) References Cited

U.S. PATENT DOCUMENTS

| | | | |
|---|---|---|---|
| 10,134,755 B2 * | 11/2018 | Tanaka .............. | H01L 27/11582 |
| 10,553,603 B2 | 2/2020 | Yamashita | |
| 10,559,586 B2 | 2/2020 | Iwasaki et al. | |
| 11,152,385 B2 * | 10/2021 | Kato .................. | H01L 27/11548 |
| 11,166,377 B2 * | 11/2021 | Nagasawa ............. | H05K 3/225 |
| 11,289,506 B2 * | 3/2022 | Omura .................. | H01L 23/528 |
| 11,296,114 B2 * | 4/2022 | Fukuzumi ......... | H01L 29/42344 |
| 11,335,696 B2 * | 5/2022 | Otaguro ............ | H01L 27/11582 |
| 2017/0077129 A1 * | 3/2017 | Kinoshita ......... | H01L 27/11575 |
| 2017/0236835 A1 | 8/2017 | Nakamura et al. | |
| 2018/0254283 A1 * | 9/2018 | Freeman .......... | H01L 21/31111 |

(Continued)

FOREIGN PATENT DOCUMENTS

| JP | 2019-9385 A | | 1/2019 |
|---|---|---|---|
| JP | 2019-160922 A | | 9/2019 |
| JP | 2020159009 A | * | 10/2020 |

*Primary Examiner* — Laura M Menz
(74) *Attorney, Agent, or Firm* — Oblon, McClelland, Maier & Neustadt, L.L.P.

(57) ABSTRACT

A semiconductor storage device according to one embodiment includes a substrate; a memory cell area having a stacked body where plural electrically conductive layers and plural first insulating layers are stacked alternately one on another, and a pillar portion that penetrates through the stacked body and provides plural memory cells; a peripheral circuit portion that intervenes between the substrate and the memory cell area, and includes a peripheral circuit for plural memory cells; a first plate-like portion that has a frame-like plan view shape and surrounds the peripheral circuit portion, the first plate-like portion being electrically conductive and connected at a lower end thereof to the substrate; a sidewall layer including silicon nitride on a side surface of the first plate-like portion; and a second insulating layer including silicon nitride, the second insulating layer being connected to the sidewall layer and covering above the peripheral circuit portion.

20 Claims, 5 Drawing Sheets

(56) References Cited

U.S. PATENT DOCUMENTS

| | | | |
|---|---|---|---|
| 2019/0006384 A1* | 1/2019 | Iwasaki | H01L 27/11575 |
| 2020/0091170 A1* | 3/2020 | Baek | H01L 21/76895 |
| 2021/0082946 A1* | 3/2021 | Nakajima | H01L 23/5226 |
| 2021/0082951 A1* | 3/2021 | Toyonaga | H01L 23/528 |
| 2021/0265374 A1* | 8/2021 | Iwasaki | G11C 5/025 |
| 2022/0005767 A1* | 1/2022 | Itai | H01L 27/11529 |
| 2022/0028701 A1* | 1/2022 | Noh | H01L 21/486 |
| 2022/0068803 A1* | 3/2022 | Ichinose | H01L 27/11575 |
| 2022/0068948 A1* | 3/2022 | Ito | H01L 27/11582 |
| 2022/0077173 A1* | 3/2022 | Yoshikawa | H01L 27/11548 |
| 2022/0084909 A1* | 3/2022 | Kinoshita | H01L 23/528 |
| 2022/0084957 A1* | 3/2022 | Nanami | H01L 27/11556 |
| 2022/0085063 A1* | 3/2022 | Tsuda | H01L 29/7889 |
| 2022/0093628 A1* | 3/2022 | Hosoda | H01L 27/11573 |
| 2022/0123006 A1* | 4/2022 | Ahn | H01L 27/11556 |

\* cited by examiner

SEMICONDUCTOR STORAGE DEVICE

CROSS-REFERENCE TO RELATED APPLICATIONS

This application is based upon and claims the benefit of priority from Japanese Patent Application No. 2020-156582, filed on Sep. 17, 2020; the entire contents of which are incorporated herein by reference.

FIELD

Embodiments described herein relate generally to a semiconductor storage device.

BACKGROUND

A manufacturing process of a semiconductor device includes, for example, a film deposition process using a chemical vapor deposition (CVD) method. When a silicon oxide layer serving as an insulating layer is deposited on an underlying layer, a source gas, which contains silicon, and an oxidation gas are decomposed and/or reacted with each other to form silicon oxide molecules, which are then adsorbed onto the underlying layer, and thus the silicon oxide layer is obtained. In this case, hydrogen atoms that are produced through decomposition and/or reaction of the source gas and the oxidation gas, and hydrogen atoms from hydrogen gas serving as dilution gas for the source gas and the like may be incorporated into the silicon oxide layer.

Such hydrogen atoms incorporated into the silicon oxide layer may diffuse through not only the silicon oxide layer but also the underlying layer, and then reach, for example, a transistor formed in an underlying portion. In this case, for example, dopants within a gate electrode formed of polycrystalline silicon may be affected, which may lead to variations and/or degradations in transistor characteristics.

DETAILED DESCRIPTION

Figure 1:
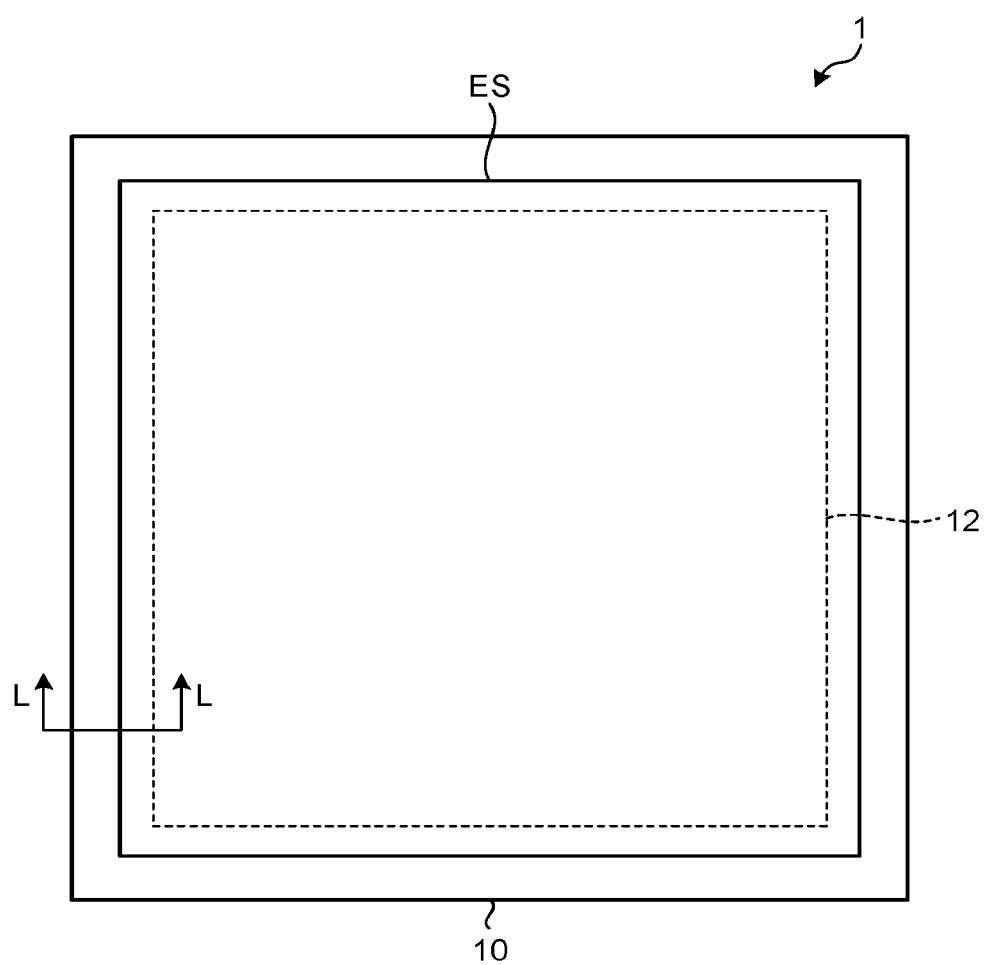
FIG. 1 is a top plan view schematically illustrating a semiconductor storage device according to the embodiment.

A semiconductor storage device according to one embodiment is provided with a substrate, a memory cell area, a peripheral circuit portion, a first plate-like portion, a sidewall layer, and a second insulating layer. The memory cell area includes a first stacked body in which a plurality of electrically conductive layers and a plurality of first insulating layers are stacked alternately one on another, and a pillar portion in which a plurality of memory cells are formed together with the plurality of electrically conductive layers. The pillar portion penetrates through the first stacked body. The peripheral circuit portion intervenes between the substrate and the memory cell area. In the peripheral circuit portion, a peripheral circuit controlling the plurality of memory cells is arranged. The first plate-like portion has a frame-like plan view shape and surrounds the peripheral circuit portion. The first plate-like portion is electrically conductive and connected at a lower end thereof to the substrate. The sidewall layer includes silicon nitride and is provided on a side surface of the first plate-like portion. The second insulating layer includes silicon nitride and is connected to the sidewall layer. The second insulating layer covers above the peripheral circuit portion.

Non-limiting, exemplary embodiments of the present invention will now be described with reference to the accompanying drawings. In the drawings, the same or corresponding reference marks are given to the same or corresponding members or components, and redundant explanations will be omitted. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

Referring now to FIG. 1, an explanation is made on a semiconductor storage device according to one embodiment. FIG. 1 is a top plan view schematically illustrating a semiconductor storage device 1 according to the embodiment. As seen in FIG. 1, the semiconductor storage device 1 according to the embodiment has a substrate 10 having a rectangular plan view shape. The substrate 10 is provided with an element area 12, and an edge seal ES is provided between the element area 12 and a periphery of the substrate 10. The edge seal ES has substantially a frame-like plan view shape and surrounds the element area 12. In the element area 12, a memory cell area MA (FIG. 2) is formed where a plurality of memory cells are arranged three-dimensionally. In a peripheral circuit portion PER (FIG. 2) provided between the substrate 10 and the memory cell area MA, a peripheral circuit is arranged which includes a transistor Tr and the like.

Figure 2:
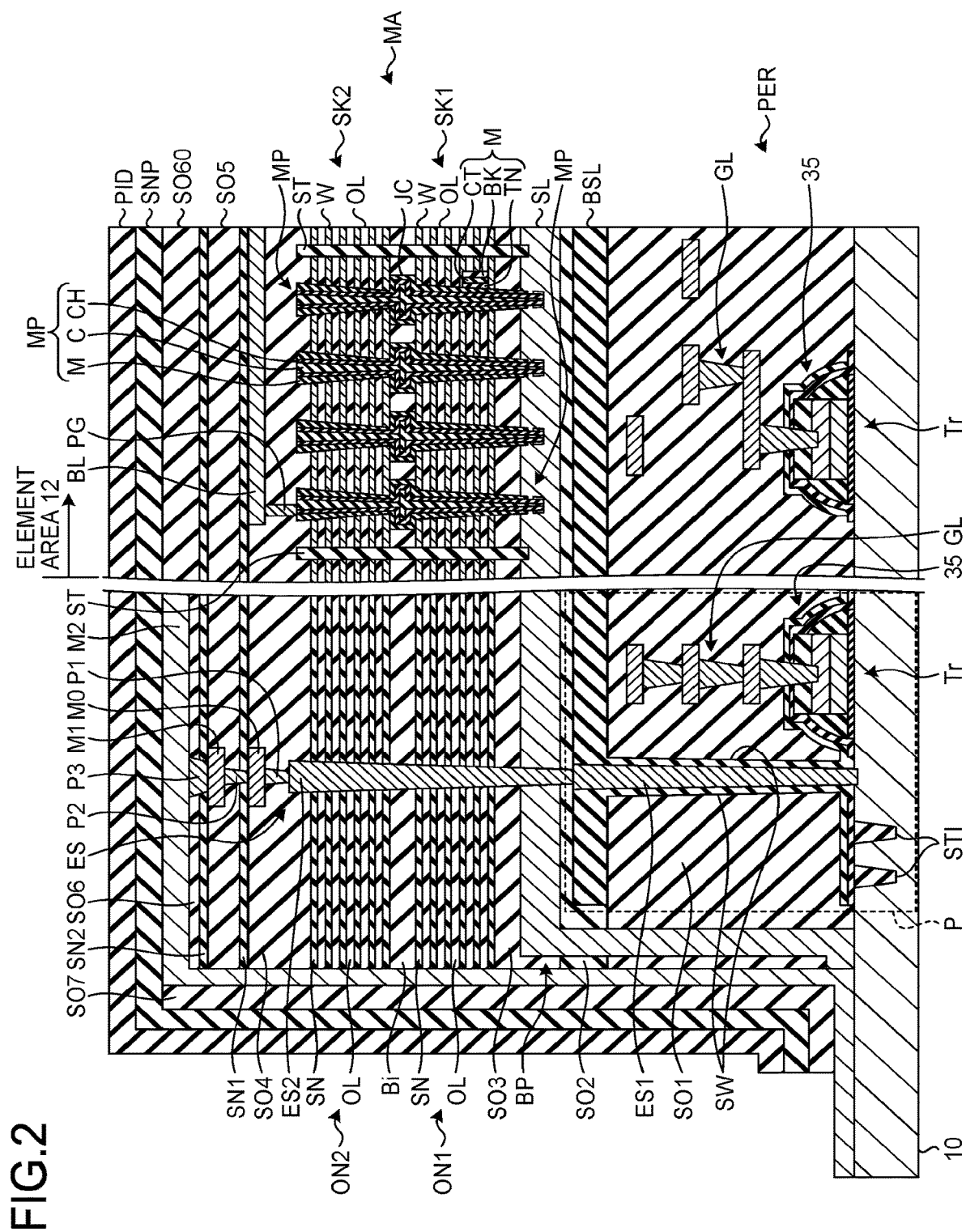
FIG. 2 is a cross-sectional view taken along the L-L line in FIG. 1.

FIG. 2 is a cross-sectional view taken along an L-L line in FIG. 1. However, in FIG. 2, one of the transistors Tr that are provided in the peripheral circuit portion PER of the element area 12 is illustrated adjacent to the edge seal ES, for convenience of the explanation. This is to indicate a positional relationship between the edge seal ES and the transistor Tr of the peripheral circuit portion PER.

As illustrated in FIG. 2, the peripheral circuit portion PER is provided on the substrate 10 formed of, for example, silicon, and thereupon the memory cell area MA is provided in the element area 12. Stacked bodies SK1, SK2 where a plurality of electrically conductive layers W and a plurality of silicon oxide layers OL are stacked alternately one on the other, and a plurality of memory pillars MP penetrating through the stacked bodies SK1, SK2 are formed in the memory cell area MA. The electrically conductive layers W may be formed of, for example, tungsten (W). The memory pillars MP each have substantially a bottomed cylindrical shape, and include a core layer C, a channel layer CH, and a memory film M that are formed in this order in a direction from the center to the outside of the memory pillar MP. Here, the core layer C may be formed of, for example, silicon oxide and the like; and the channel layer CH may be formed of, for example, polycrystalline silicon, amorphous silicon and the like. Additionally, as illustrated in FIG. 2, the memory film M has a tunneling insulation layer TN, a charge accumulation layer CT, and a block insulation layer BK that are formed in this order in a direction from the center to the outside of the memory pillar MP. The tunneling insulation layer TN and the block insulation layer BK may be formed of, for example, silicon oxide and the like, and the charge accumulation layer CT may be formed of, for example, silicon nitride.

Additionally, the memory pillar MP has an upper portion corresponding to the stacked body SK2 and a lower portion corresponding to the stacked body SK1, and the upper and lower portions are united by a junction JC. Namely, in the memory pillar MP, the core layer C, the channel layer CH, and the memory film M extend continuously between the upper portion and the lower portion. Note that the junction JC is arranged within a junction layer Bi interposed between the stacked body SK1 and the stacked body SK2. The memory cells are formed in portions where the electrically conductive layers W in the stacked bodies SKI, SK2 are opposed to the memory pillars MP. The channel layer CH of the memory pillar MP is connected to a plug PG and a bit line BL both of which are buried within a silicon oxide film SO4. The plug PG and the bit line BL may be formed of, for example, copper (Cu) by a damascene method. Note that, in FIG. 2, while a pair of the plug PG and the bit line BL that are connected to one memory pillar MP is illustrated, the plugs PG and the bit lines BL that are connected to other memory pillars MP are not illustrated. The bit line BL is connected to the peripheral circuit through, for example, an unillustrated connection line that penetrates through the stacked bodies SK1, SK2 and the like. On the silicon oxide film SO4 and the bit line BL, a silicon nitride film SN1, a silicon oxide film SO5, a silicon nitride film SN2 and a silicon oxide film SO60 are formed in this order.

Additionally, plural slits ST are provided in the memory cell area MA. The plural slits ST penetrate through the stacked bodies SK1, SK2 and the junction layer Bi, and extend in a direction vertical to the paper surface of FIG. 2. The stacked bodies SK1, SK2 are divided into plural areas (also known as blocks) by the plural slits ST. An insulating material such as silicon oxide is filled into the slits ST. However, an electrically conductive material may be filled into the slits ST so that an insulating material is interposed between the electrically conductive material and the sidewalls of the slits ST, which allows this electrically conductive material to function as a source line contact by being connected to a source layer SL.

Additionally, in the peripheral circuit portion PER, the transistor Tr, which is a part of the peripheral circuits, is formed on a superficial layer of the substrate 10, and covered with an liner layer 35 that is described later referring to FIG. 3. A silicon oxide film SO1 is formed on the liner layer 35, and a silicon nitride layer BSL is formed on the silicon oxide film SO1. The silicon nitride layer BSL may have a function as, for example, an etching stopper layer when connection lines and the like are formed which electrically connect the peripheral circuit portion PER and the memory cells in the element area 12.

An upper surface of the silicon nitride layer BSL and an upper surface of the silicon oxide film SO1 are covered with a silicon oxide film SO2, and the source layer SL is formed on the silicon oxide film SO2. The source layer SL may be formed of an n-type polycrystalline silicon doped with phosphorus. Alternatively, the source layer SL may include two layers of an electrically conductive layer and a semiconductor layer. The electrically conductive layer may be formed of, for example, tungsten (W) or tungsten silicide (WSi). The semiconductor layer may be formed of an n-type polycrystalline silicon on the electrically conductive layer. The source layer SL is in contact with an outer peripheral surface of a lower portion of the channel layer CH of the memory pillar MP and functions as a source line of the memory cells of which channel is formed in the channel layer CH of the memory pillar MP. Note that while the source layer SL is formed substantially in parallel with an upper surface of the substrate 10, the source line SL has a bent portion BP at the edge portion thereof, which allows the source layer SL to bend towards the substrate 10 and to be connected to the surface of the substrate 10. After the source layer SL is formed, plasma processes such as a film deposition and etching utilizing plasma are performed. In this case, a structure that has been formed before such plasma processes is exposed to electric charges in plasma. In order to release such an electric charge to the substrate 10 through the source layer SL, and thus to protect the existing structure from the electric charge, the source layer SL is connected to the substrate 10.

A stacked body ON1 is formed above an area between the element area 12 and the peripheral edge of the substrate 10, with a silicon oxide film SO3 interposed therebetween. On the stacked body ON1, a stacked body ON2 is formed with the junction layer Bi interposed therebetween. The stacked bodies ON1 and ON2 have a stacked structure where plural silicon nitride layers SN and plural silicon oxide layers OL are stacked alternately one on the other. The junction layer Bi may be formed of, for example, silicon oxide.

The silicon nitride layers SN of the stacked bodies ON1, ON2 are replaced with, for example, metal such as tungsten (W) and the like in the element area 12. Portions where the silicon nitride layers SN of the stacked bodies ON1, ON2 are replaced with metal such as W and the like correspond to the stacked bodies SK1, SK2. Namely, the stacked body ON1 and the stacked body SK1 of the element area 12 are connected with each other, having the silicon oxide layers OL in common; and the stacked body ON2 and the stacked body SK2 of the element area 12 are connected with each other, having the silicon oxide layers OL in common.

On the stacked body ON2, the silicon oxide film SO4, the silicon nitride film SN1, the silicon oxide film SO5, the silicon nitride film SN2, and a silicon oxide film SO6 are formed in this order. A metal body M2 is formed to cover an upper surface of the silicon oxide film SO6, side surfaces of the silicon oxide films SO1, SO2, SO3, the stacked body ON1, the junction layer Bi, the stacked body ON2, the silicon oxide films SO4, SO5, SO6, the silicon nitride films SN1, SN2, and the upper surface of the substrate 10. The metal body M2 can be formed of, for example, aluminum (Al), aluminum alloy such as AlCuSi, and the like. The metal body M2 is provided to avoid the semiconductor storage device 1 from being charged with electricity.

Note that after the metal body M2 is formed, a silicon oxide film is deposited to cover the metal body M2, and the deposited silicon oxide film is polished, for example, by a Chemical Mechanical Polishing (CMP) method, which allows the metal body M2 to be exposed. With this, a silicon oxide film SO7 is obtained which covers a side surface of the metal body M2 and a part of the metal body M2 on the substrate 10. Then, the silicon nitride film SNP as a passivation film is formed on the entire surface, and a protection film PID is formed of, for example, polyimide, to cover the silicon nitride film SNP. With this, on an edge portion of the upper surface of the substrate 10, the metal body M2, the silicon oxide film SO7, the silicon nitride film SNP, and the protection film PID are also stacked in this order. Portions of the silicon oxide film SO7, the silicon nitride film SNP, and the protection film PID that are stacked on the edge portion of the upper surface of the substrate 10 are removed, and the metal body M2 is exposed. A portion where the metal body M2 is exposed corresponds to a kerf area set aside for dicing, for example, a silicon wafer where the semiconductor storage devices 1 are manufactured.

Additionally, the edge seal ES has an edge seal portion ES1, an edge seal portion ES2, a frame body P1, a metal body M0, a frame body P2, a metal body M1, and a frame body P3 that are stacked in this order on the substrate 10 in this embodiment. The edge seal ES has a function to prevent cracks, which may occur originating from a dicing line, from advancing into the element area 12. Additionally, the edge seal ES has another function to restrict atmospheric water from entering the element area 12. Moreover, the edge seal ES has yet another function to release an electric charge in plasma to the substrate 10 in the plasma process as one of the manufacturing processes, as with the above-mentioned the source layer SL.

The edge seal portion ES1, which is connected at a lower end thereof to the substrate 10, extends to an upper end of the silicon nitride layer BSL as described later. The edge seal portion ES2, which is connected at a lower end thereof to the edge seal portion ES1, extends to penetrate through the silicon oxide film SO2, the source layer SL, the silicon oxide film SO3, the stacked body ON1, the junction layer Bi, and the stacked body ON2, and then terminates within the silicon oxide film SO4. The edge seal portions ES1, ES2 may be formed of, for example, metal such as tungsten and the like. However, the edge seal portions ES1, ES2 may have a main body portion formed of tungsten, and a titanium nitride layer or a titanium layer that covers a lower and side surface of the main body portion.

The frame body P1 and the metal body M0 are buried in the silicon oxide film SO4, and connected to an upper end of the edge seal portion ES2 having a bottom end of the frame body P1 thereon. The frame body P2 and the metal body M1, which penetrate through the silicon oxide film SO5 and the silicon nitride film SN1, are connected to an upper surface of the metal body M0 having a bottom end of the frame body P2 thereon. Additionally, the frame body P3, which penetrates through the silicon oxide film SO6 and the silicon nitride film SN2, is connected at a lower end thereof to an upper surface of the metal body M1 and connected at an upper end thereof to a lower surface of the metal body M2. The frame body P1, the metal body M0, the frame body P2, the metal body M1, and the frame body P3 may be formed of, for example, Cu by the damascene method.

Note that the silicon nitride film SN1, which is formed on the silicon oxide film SO4, and the silicon nitride film SN2, which is formed on the silicon oxide film SO5, are provided in order to maintain withstand voltage. For example, in the element area 12, the plug PG and the bit line BL that are formed of, for example, Cu are buried in the silicon oxide film SO4. If a voltage is applied to the plug PG and the bit line BL under such a situation where the silicon nitride film SN1 is not formed, Cu atoms may diffuse, which results in decreased withstand voltage between, for example, the Cu lines. The silicon nitride film SN1 capable of restricting diffusion of Cu atoms is provided to prevent the withstand voltage from reducing. Plugs and lines (not shown) formed of, for example, Cu may be buried in the silicon oxide film SO5, and the silicon nitride film SN2 is formed to restrict such diffusion of Cu atoms.

Figure 3:
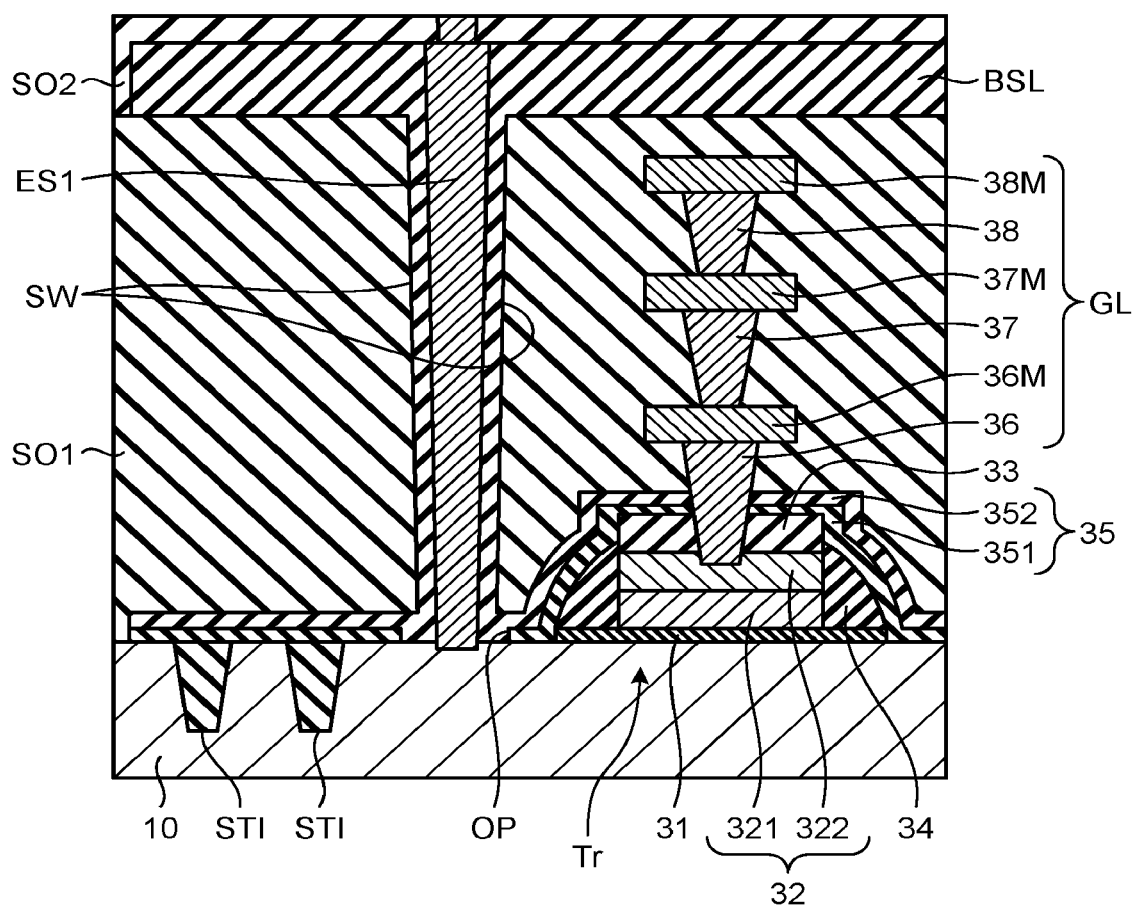
FIG. 3 is a partially enlarged views of FIG. 2.

Next, referring to FIG. 3, an explanation is made on the edge seal portion ES1, the transistor Tr, and a structure therearound. FIG. 3 is a partially enlarged view of FIG. 2, and corresponds to a portion P surrounded by a dotted line in FIG. 2.

As illustrated in FIG. 3, a gate insulating film 31 of the transistor Tr is formed in an upper surface of the substrate 10, and a gate electrode 32 is formed on the gate insulating film 31. The gate insulating film 31 is formed by thermally oxidizing the upper surface of the substrate 10 formed of silicon. For example, the gate electrode 32 may have a boron (B) doped polysilicon layer 321 deposited on the gate insulating film 31, and a tungsten layer 322 deposited on the polysilicon layer 321. Note that a source region and a drain region of the transistor Tr are formed in a superficial area of the substrate 10 across the gate electrode 32 along the direction perpendicular to the paper surface of FIG. 3.

Additionally, a cap layer 33 is formed on the gate electrode 32, and sidewall spacers 34 are formed on both sides of the gate electrode 32. The cap layer 33 may be formed of silicon nitride, and the sidewall spacers 34 may be formed of silicon oxide.

The liner layer 35 is deposited to cover the cap layer 33 and the sidewall spacers 34. For example, the liner layer 35 may include a first liner layer 351 and a second liner layer 352. The first liner layer 351 is formed of, for example, silicon oxide and is in contact with the cap layer 33, the sidewall spacers 34, and the substrate 10. The first liner layer 351 has an opening OP on the substrate 10. On the other hand, the second liner layer 352 may be formed of silicon nitride, to cover the first liner layer 351. The second liner layer 352 is in contact with the substrate 10 through the opening OP of the first liner layer 351.

Additionally, a gate line GL is provided to the gate electrode 32. The gate line GL penetrates through the liner layer 35 and the cap layer 33. The gate line GL has a gate contact 36 connected to a tungsten layer 322 in the gate electrode 32; a metal interconnect layer 36M connected to an upper end of the gate contact 36; and a plug 37, a metal interconnect layer 37M, a plug 38, and a metal interconnect layer 38M that are formed in this order on the metal interconnect layer 36M. Namely, a three-level metal interconnect structure having the metal interconnect layers 36M, 37M, 38M is formed within the silicon oxide film SO1. Although not illustrated in FIGS. 2 and 3, another one of the gate line GL having a metal interconnect structure similar to that illustrated may be formed to the source region and the drain region of the transistor Tr. The gate line GL may be formed of metal such as Cu and the like by, for example, the damascene method. Note that a recess may be formed in the tungsten layer 322, and the gate contact 36 is connected to this recess, in order to reduce resistance between the gate contact 36 and the tungsten layer 322.

The edge seal portion ES1 penetrates through the silicon nitride layer BSL and the silicon oxide film SO1 and reaches the substrate 10. Here, a bottom end of the edge seal portion ES1 is connected to the substrate 10 through the opening OP of the first liner layer 351. Namely, the edge seal portion ES1 is spaced from the first liner layer 351 formed of silicon oxide. Additionally, the bottom end of the edge seal portion ES1 is fitted into the recess formed in the upper surface of the substrate 10, and thus the edge seal portion ES1 can be tightly connected to the substrate 10. As a result, the edge seal ES (FIG. 2) is capable of functioning more effectively as the crack stopper at the time of the dicing process. Note that an n-type or p-type impurity diffusion region (not illustrated) is arbitrarily formed on an area of the superficial layer where the bottom end of the edge seal portion ES1 is connected in the substrate 10.

Sidewall layers SW formed of silicon nitride are provided on both sides of the edge seal portion ES1. The silicon nitride layer BSL is connected to upper ends of the sidewall layers SW, and the second liner layer 352 formed on the upper surface of the substrate 10 is connected to lower ends of the sidewall layers SW. Namely, an area is produced which is surrounded in the second liner layer 352, the sidewall layer SW, and the silicon nitride layer BSL. The peripheral circuit including the transistor Tr is arranged within the area.

The sidewall layers SW and the edge seal portion ES1 may be formed, for example, as follows. The silicon oxide film SO1 including the gate line GL and the silicon nitride layer BSL are formed in this order after the transistor Tr (including the cap layer 33, the sidewall spacers 34, and the liner layer 35) is formed to the superficial layer of the substrate 10. After this, a trench is formed which has a frame-like plan view shape. This trench penetrates through the silicon nitride layer BSL and the silicon oxide film SO1, and reach the substrate 10, and traverses the silicon nitride layer BSL and the silicon oxide film SO1. After silicon nitride is deposited conformal to an inner surface of the trench and then the silicon nitride on a bottom surface of the trench is removed, metal such as tungsten is filled into the trench. With this, the sidewall layers SW and the edge seal portion ES1 are formed. Note that before the trench is filled in, a layer of TiN or Ti may be formed on the inner and bottom surface of the trench where the silicon nitride layer has been removed, and then tungsten may be filled into the inside of the layer of TiN or Ti. Additionally, a recess may be formed in the upper surface of the substrate 10 when removing the silicon nitride layer on the bottom surface of the trench.

Note that double trenches STI having, for example, silicon oxide filled therein are formed in the superficial layer of the substrate 10. Each of the trenches STI has the frame-like plan view shape and surrounds the edge seal ES. The trenches STI function as crack stoppers preventing a crack from advancing the substrate 10 at the time of the dicing process.

Figure 4:
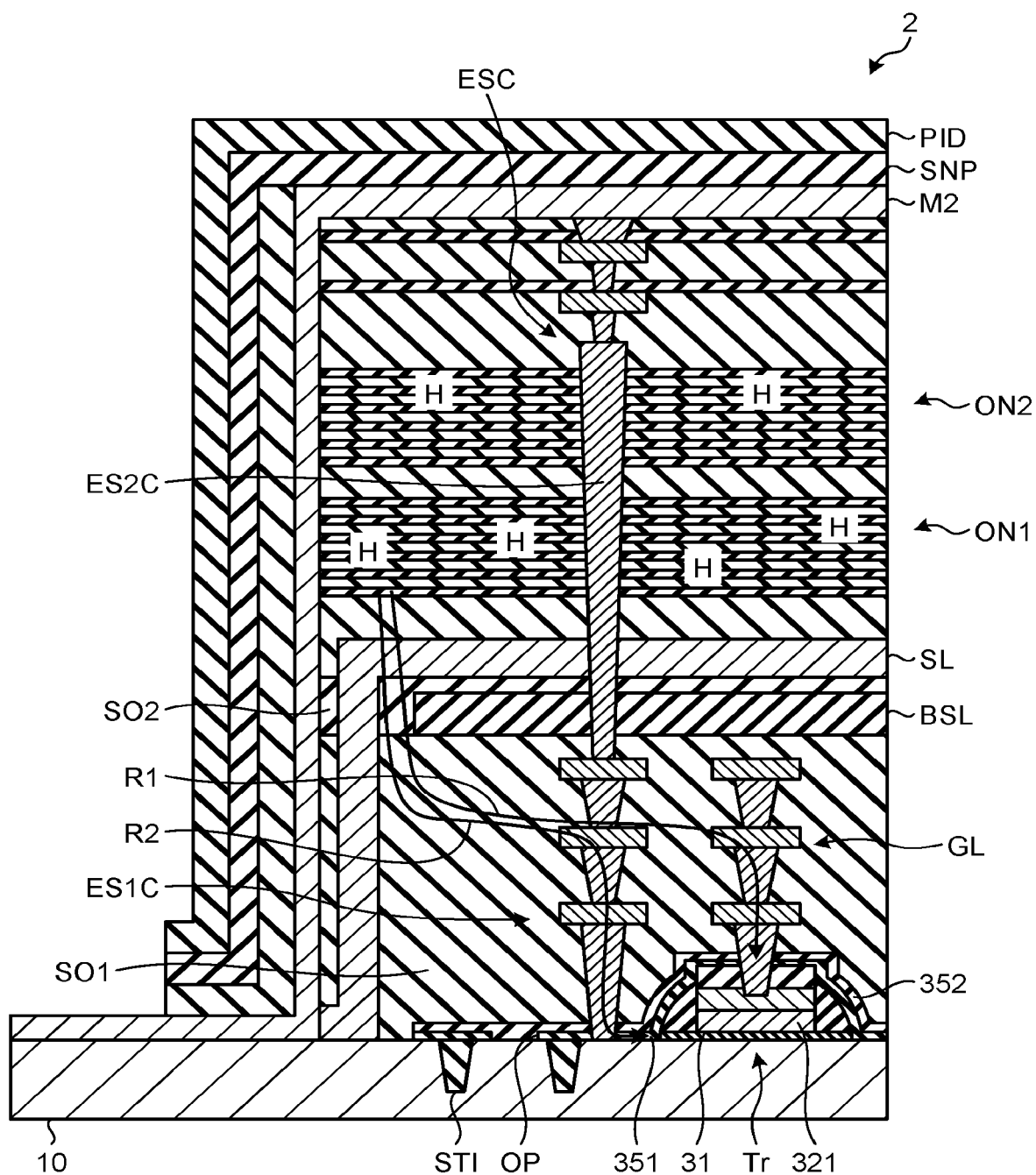
FIG. 4 is a cross-sectional view schematically illustrating a cross section of an edge portion of a semiconductor storage device according to the comparative example.

In the following, an explanation is made on at least one effect brought about by the semiconductor storage device 1 according to the present embodiment, referring to a comparative example. FIG. 4 is a cross-sectional view schematically illustrating a cross section of an edge portion of a semiconductor storage device according to the comparative example. As illustrated in FIG. 4, a semiconductor storage device 2 according to the comparative example is provided with an edge seal portion ES1C that is different from the edge seal portion ES1 in the embodiment. In the comparative example, the edge seal portion ES1C is formed concurrently with, for example, the gate line GL, and therefore the three level metal interconnect structure is provided which is the same as the gate line GL. An edge seal portion ES2C is connected at a lower end thereof to an upper surface of the uppermost line of the three level metal interconnect structure, and thus an edge seal ESC is formed.

Additionally, differently from the embodiment, any layer formed of silicon nitride corresponding to the sidewall layer SW is not provided on the sidewall of the edge seal portion ES1C. Moreover, the opening OP of the first liner layer 351 of the liner layer 35 is provided at the position different from the bottom end of the edge seal portion ES1C, and thus the bottom end of the edge seal portion ES1C is in contact with the first liner layer 351 formed of silicon oxide. As for the other parts or elements, the semiconductor storage device 2 according to the comparative example is similar to the semiconductor storage device 1 according to the embodiment.

The stacked bodies ON1, ON2 are formed by, for example, the plasma CVD process, during which hydrogen (atoms) in a vapor phase tends to be incorporated into the stacked bodies ON1, ON2. Symbols "H" in FIG. 4 schematically depicts hydrogen incorporated in the stacked bodies ON1, ON2. Such hydrogen may diffuse and reach the transistor Tr, when a high temperature process is performed, for example, to form the memory pillars MP and like in the memory cell area MA as a subsequent process. When this happens, boron atoms doped into the polysilicon layer 321 of the gate electrode 32 may go through the gate insulating film 31 into the substrate 10 due to the diffused hydrogen. As a result, a resistance value of the polysilicon layer 321 may vary, and a carrier concentration of the channel area under the gate insulating film 31 may vary. With this, reduction and/or variations of a threshold voltage of the transistor Tr may occur.

Hydrogen can diffuse through metal, polycrystalline silicon, and silicon oxide. Therefore, hydrogen in the stacked body ON1 can penetrate into the silicon oxide film SO1 through, for example, the source layer SL and the silicon oxide film SO2, and move across the edge seal portion ES1C, thereby to reach the transistor Tr through the gate line GL, following a route R1 indicated in FIG. 4. Additionally, hydrogen can penetrate into the silicon oxide film SO1 through, for example, the source layer SL and the silicon oxide film SO2, further enter the edge seal portion ES1C and move downward, thereby to reach the transistor Tr through the first liner layer 351 from the bottom end of the edge seal portion ES1C, following a route R2 indicated in FIG. 4.

In the semiconductor storage device 1 according to the present embodiment, hydrogen is also incorporated mainly into the stacked bodies ON1, ON2 during a manufacturing process. In the present embodiment, however, an area is formed which is surrounded by the second liner layer 352, the sidewall layers SW, and the silicon nitride layer BSL, each of which is formed of silicon nitride, and the transistor Tr is arranged in the area. Specifically, because the sidewall layers SW formed of silicon nitride are provided on the side surfaces of the edge seal portion ES1, hydrogen, which is hard to diffuse through silicon nitride, scarcely reach the gate line GL.

Additionally, the bottom end of the edge seal portion ES1 is connected to the substrate 10 through the opening OP of the first liner layer 351 formed of silicon oxide, and the bottom ends of the sidewall layers SW are also connected to the surface of the substrate 10. Moreover, the bottom ends of the sidewall layers SW are in contact also with the second liner layer 352 formed of silicon nitride on the upper surface of the substrate 10. Therefore, even if hydrogen penetrates into the edge seal portion ES1 through the source layer SL and the silicon oxide film SO2 and moves downward to the bottom end of the edge seal portion ES1, the hydrogen is blocked by the sidewall layers SW and the second liner layer 352, and thus scarcely reaches the transistor Tr. Therefore, the hydrogen that moves into the transistor Tr from the stacked bodies ON1, ON2 can be reduced, which may result in reduction and/or variations of the threshold voltage of the transistor Tr. Note that, while the sidewall layers SW and the second liner layer 352 are in direct contact with the surface of the substrate 10 in this embodiment, the sidewall layers SW and the second liner layer 352 may be provided to be in contact with the upper surface of the substrate 10 through native silicon oxide on the substrate 10 in other embodiments. Such a native silicon oxide film is generally thinner than the first liner layer 351 used as the liner layer 35, the hydrogen blocking effect brought about by the sidewall layers SW and the second liner layer 352 connected to the upper surface of the substrate 10 is scarcely impaired, even if the native silicon oxide film is intervened therebetween.

Additionally, because the silicon nitride layer BSL is formed of silicon nitride, hydrogen within the stacked bodies SK1, SK2 are inhibited from diffusing downward (towards the silicon oxide film SO1). Note that an opening for forming electrical connection that connects the memory cell and the peripheral circuit may be formed in the silicon nitride layer BSL. However, an amount of hydrogen in the stacked bodies SK1, SK2 has been already reduced by the time and hydrogen scarcely diffuses from the stacked bodies SK1, SK2 to outside during a process to form such an opening. Therefore, the silicon nitride layer BSL may have an opening for forming the electrical connection line.

Additionally, in the comparative example, the edge seal portion ES1C has the three level metal interconnect structure similar to the gate line GL for the transistor Tr. Therefore, when sidewall layers similar to the sidewall layers SW in the embodiment is provided, a complexity of a manufacturing process, an increase of the number of the process steps, an increase in production costs and the like may be caused. In the semiconductor storage device 1 according to the embodiment, the edge seal portion ES1 is formed in one body so as to extend from the silicon nitride layer BSL through the upper surface of the substrate 10, and the sidewall layers SW and the edge seal portion ES1 can be formed by a simplified process, separately from the gate line GL.

Modification(s)

Figure 5:
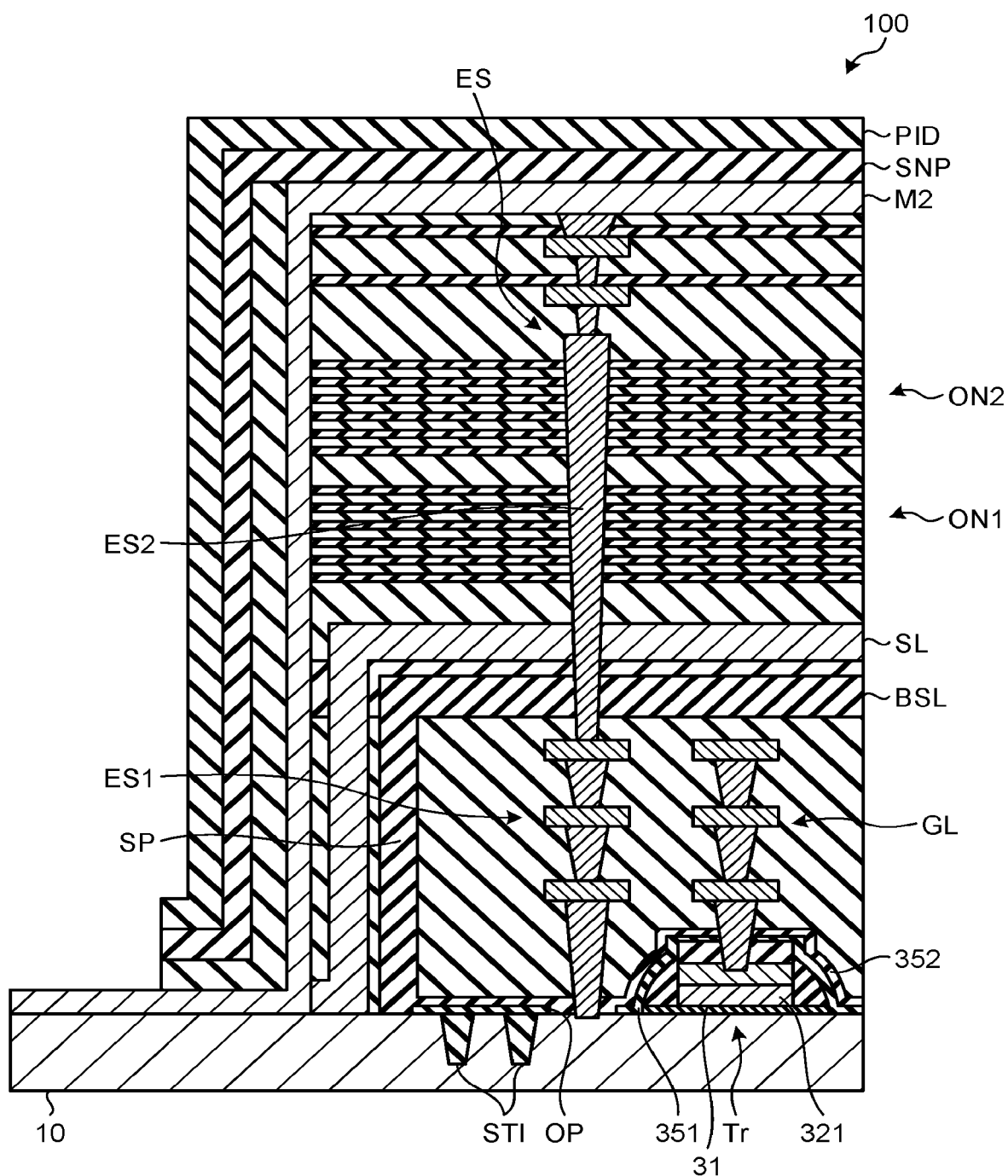
FIG. 5 is a view schematically illustrating a cross section of an edge portion of a semiconductor storage device according to modification of the embodiment.

Referring now to FIG. 5, an explanation is made on a semiconductor storage device 100 according to modification of the embodiment. FIG. 5 is a cross-sectional view schematically illustrating a cross section of an edge portion of the semiconductor storage device 100 according to the modification of the embodiment. Note that the semiconductor storage device 100 has the same element area 12 as in the semiconductor storage device 1, although not illustrated in FIG. 5. As illustrated in FIG. 5, the edge seal portion ES1 of the semiconductor storage device 100 has a three level metal interconnect structure that is substantially the same as that of the gate line GL, and any sidewall layers are not provided on the sidewalls of the edge seal portion ES1. On the other hand, a standing portion SP is provided which has a frame-like plan view shape, formed of silicon nitride. The standing portion SP is in contact at a lower end thereof to the upper surface of the substrate 10 on the peripheral side of the edge portion of the first liner layer 351 formed of silicon oxide. Additionally, the standing portion SP is connected at the upper end thereof to the lower surface of the silicon nitride layer BSL. In other words, a lidded square cylinder is formed which has the silicon nitride layer BSL as a lid and the standing portion SP as sidewalls, and within such a lidded square cylinder, the transistor Tr is formed on the superficial layer of the substrate 10. Note that the edge seal portion ES1 may be formed when the gate line GL is formed. Additionally, the number of metal layers included in the edge seal portion ES1 may be two, four or more, not limited to three.

According to such a configuration, hydrogen is inhibited from diffusing toward the transistor Tr from the stacked bodies ON1, ON2 by the silicon nitride layer BSL and the standing portion SP both of which are formed of silicon nitride. Note that because the silicon nitride layer BSL in this configuration is traversed by the edge seal portion ES2, hydrogen may diffuse therethrough. However, before the edge seal portion ES2 is formed, formation of the memory pillars MP and the like is performed through high temperature processes, during which a large amount of hydrogen is degassed from the stacked bodies ON1, ON2 to outside. Therefore, an amount of hydrogen that remains in the stacked bodies ON1, ON2 is sufficiently reduced when the edge seal portion ES2 is formed so as to penetrate through the stacked bodies ON1, ON2, the silicon nitride layer BSL, and the like. Accordingly, diffusion of hydrogen scarcely matters regardless of the edge seal portion ES2 traversing the silicon nitride layer BSL, as is the case with the above-mentioned opening for forming the electrical connection line. Additionally, the lower end of the edge seal portion ES1 is connected to the upper surface of the substrate 10 in the opening OP of the first liner layer 351. Therefore, even if hydrogen enters the edge seal portion ES1 and moves downward the bottom end of the edge seal portion ES1, the hydrogen is blocked by the second liner layer 352 connected to the upper surface of the substrate 10, and scarcely reach the transistor Tr. Namely, as with the semiconductor storage device 1 according to the embodiment, hydrogen diffusing into the transistor Tr from the stacked bodies ON1, ON2 is reduced, which may result in reduction and/or variations in a threshold voltage of the transistor Tr.

Note that the standing portion SP may be provided between the trench STI and the edge seal portion ES1 such that a lower end of the standing portion SP is connected to the substrate 10 and an upper end of the standing portion SP is connected to the silicon nitride layer BSL. Additionally, the standing portion SP may be provided between the edge seal portion ES1 and the transistor Tr such that the lower end of the standing portion SP is connected to the substrate 10 and the upper end thereof is connected to the silicon nitride layer BSL. In these cases, an opening corresponding to the standing portion SP is provided in the first liner layer 351. This opening may be formed concurrently with the opening portion OP for the edge seal portion ES1.

Other Modifications

In the above-mentioned embodiment, while one edge seal ES is provided which surrounds the element area 12, an additional edge seal may be provided outside or inside the edge seal ES. In other words, multiple edge seals may be provided. In this case, the sidewall layers SW may be provided on one or more of sidewalls of portions corresponding to the edge seal ES in the multiple edge seals.

Additionally, as mentioned above, the lower end of the edge seal portion ES1 is connected to the substrate 10 through the opening OP of the first liner layer 351 formed of silicon oxide of the liner layer 35, and thus spaced from the first liner layer 351. However, the opening OP may be located between the lower end of the edge seal portion ES1 and the transistor Tr. In this case, the lower end of the edge seal portion ES1 may be in contact with the first liner layer 351. However, because the second liner layer 352 formed of silicon nitride is in contact with the substrate 10 in the opening OP, a route from the lower end of the edge seal portion ES1 through the first liner layer 351 to the transistor Tr is blocked. Furthermore, the opening OP is not necessarily formed between the transistor Tr and an edge portion of the first liner layer 351 in the first liner layer 351. In this case, the sidewall layers SW formed of silicon nitride are in contact with the substrate 10 in the sides of the edge seal portion ES1. Therefore, even if hydrogen enters the edge seal portion ES1 through the source layer SL and the silicon oxide film SO2, a route at least from the lower end of the edge seal portion ES1 toward the first liner layer 351 is blocked by the sidewall layers SW. Therefore, hydrogen is reduced which diffuses into the transistor Tr also in this case.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a substrate;
   a memory cell area including a first stacked body in which a plurality of electrically conductive layers and a plurality of first insulating layers are stacked alternately one on another, and a pillar portion in which a plurality of memory cells are formed together with the plurality of electrically conductive layers, the pillar portion penetrating through the first stacked body;
   a peripheral circuit portion in which a peripheral circuit controlling the plurality of memory cells is arranged, the peripheral circuit portion intervening between the substrate and the memory cell area;
   a first plate-like portion that has a frame-like plan view shape and surrounds the peripheral circuit portion, the first plate-like portion being electrically conductive and connected at a lower end thereof to the substrate;
   a sidewall layer including silicon nitride and being provided on a side surface of the first plate-like portion; and
   a second insulating layer including silicon nitride, the second insulating layer being connected to the sidewall layer and covering above the peripheral circuit portion.

2. The semiconductor storage device according to claim 1, further comprising:
   a third insulating layer having an opening and being formed on the substrate; and
   a fourth insulating layer including silicon nitride and being provided on the third insulating layer, the fourth insulating layer being connected to the sidewall layer and connected to the substrate through the opening.

3. The semiconductor storage device according to claim 2, wherein
   the lower end of the first plate-like portion is connected to the substrate through the opening.

4. The semiconductor storage device according to claim 3, wherein
   the substrate has a recessed portion in a position corresponding to the opening; and
   the lower end of the first plate-like portion is fitted in the recessed portion.

5. The semiconductor storage device according to claim 1, further comprising an electrically conductive film being provided above the second insulating layer and functioning as a source line for the plurality of memory cells.

6. The semiconductor storage device according to claim 5, wherein the electrically conductive film is bent at an end portion of the second insulating layer and connected to the substrate.

7. The semiconductor storage device according to claim 1, wherein the first plate-like portion is formed in one body at least from a level corresponding to an lower end of the second insulating layer to an upper surface of the substrate along a stacking direction of the first stacked body.

8. The semiconductor storage device according to claim 7, wherein the first plate-like portion penetrates through the second insulating layer.

9. The semiconductor storage device according to claim 1, further comprising:
   a second stacked body in which a plurality of fifth insulating layers and a plurality of sixth insulating layers are stacked alternately one on another, the second stacked body being arranged above the first plate-like portion; and
   a second plate-like portion penetrating through the second stacked body, the second plate-like portion being electrically conductive and connected at a lower end thereof to the first plate-like portion.

10. The semiconductor storage device according to claim 9, wherein the second plate-like portion has a frame-like plan view shape.

11. A semiconductor storage device comprising:
    a substrate;
    a memory cell area including a first stacked body in which a plurality of electrically conductive layers and a plurality of first insulating layers are stacked alternately one on another, and a pillar portion in which a plurality of memory cells are formed together with the plurality of electrically conductive layers, the pillar portion penetrating through the first stacked body;
    a peripheral circuit portion in which a peripheral circuit controlling the plurality of memory cells is arranged, the peripheral circuit portion intervening between the substrate and the memory cell area;
    a first frame body that has a frame-like plan view shape and surrounds the peripheral circuit portion, the first frame body including silicon nitride and being connected at a lower end thereof to the substrate; and
    a second insulating layer including silicon nitride, the second insulating layer being connected to an upper end of the first frame body and covering above the peripheral circuit portion.

12. The semiconductor storage device according to claim 11, further comprising a first electrically conductive member arranged between the peripheral circuit portion and the first frame body, the first electrically conductive member being connected at a lower end thereof to the substrate.

13. The semiconductor storage device according to claim 12, wherein the first electrically conductive member has a multilayer line structure between the substrate and the second insulating layer.

14. The semiconductor storage device according to claim 13, wherein
    the peripheral circuit portion includes at least one transistor; and
    a line connected to the at least one transistor has a multilayer line structure that is substantially a same as the multilayer line structure of the first electrically conductive member.

15. The semiconductor storage device according to claim 11, further comprising:
    a third insulating layer having an opening and being formed on the substrate; and
    a fourth insulating layer including silicon nitride and being provided on the third insulating layer, the fourth insulating layer being connected to the first frame body and connected to the substrate through the opening.

16. The semiconductor storage device according to claim 15, further comprising a first electrically conductive member being arranged between the peripheral circuit portion and the first frame body, and connected at a lower end thereof to the substrate, wherein the lower end of the first electrically conductive member is connected to the substrate through the opening.

17. The semiconductor storage device according to claim 11, further comprising an electrically conductive film being provided above the second insulating layer and functioning as a source line for the plurality of memory cells.

18. The semiconductor storage device according to claim 17, wherein the electrically conductive film is bent at an end portion of the second insulating layer and connected to the substrate.

19. The semiconductor storage device according to claim 12, further comprising:
- a second stacked body in which a plurality of fifth insulating layers and a plurality of sixth insulating layers are stacked alternately one on another, the second stacked body being arranged above the first frame body; and
- a second electrically conductive member connected at a lower end thereof to the first electrically conductive member, the second electrically conductive member penetrating through the second stacked body and the second insulating layer.

20. The semiconductor storage device according to claim 19, wherein the first electrically conductive member and the second electrically conductive member have a frame-like plan view shape.

* * * * *